United States Patent
Endo

(10) Patent No.: US 9,229,052 B2
(45) Date of Patent: Jan. 5, 2016

(54) STACK INCLUDING INSPECTION CIRCUIT, INSPECTION METHOD AND INSPECTION APPARATUS

(71) Applicant: KABUSHIKI KAISHA TOSHIBA, Minato-Ku, Tokyo (JP)

(72) Inventor: Mitsuyoshi Endo, Yamato (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 291 days.

(21) Appl. No.: 13/945,298

(22) Filed: Jul. 18, 2013

(65) Prior Publication Data

US 2014/0210497 A1 Jul. 31, 2014

(30) Foreign Application Priority Data

Jan. 31, 2013 (JP) .................................. 2013-016958

(51) Int. Cl.
| | |
|---|---|
| *G01R 31/3187* | (2006.01) |
| *G01R 31/307* | (2006.01) |
| *H01L 21/66* | (2006.01) |
| *G01R 31/04* | (2006.01) |
| *G01R 31/28* | (2006.01) |

(52) U.S. Cl.
CPC .............. *G01R 31/307* (2013.01); *H01L 22/34* (2013.01); *G01R 31/048* (2013.01); *G01R 31/2856* (2013.01); *H01L 2224/13* (2013.01); *H01L 2224/16* (2013.01); *H01L 2924/1305* (2013.01)

(58) Field of Classification Search
None
See application file for complete search history.

(56) References Cited

U.S. PATENT DOCUMENTS

| | | | | |
|---|---|---|---|---|
| 6,011,404 A | * | 1/2000 | Ma et al. ................... | 324/754.05 |
| 6,310,487 B1 | * | 10/2001 | Yokomizo .......... | G01R 31/2884 |
| | | | | 324/750.3 |
| 2011/0077877 A1 | | 3/2011 | Nikaido | |

FOREIGN PATENT DOCUMENTS

| | | |
|---|---|---|
| JP | 2005-347773 A | 12/2005 |
| JP | 2007-155449 A | 6/2007 |

* cited by examiner

*Primary Examiner* — Paresh Patel
(74) *Attorney, Agent, or Firm* — Holtz, Holtz, Goodman & Chick PC

(57) ABSTRACT

According to one embodiment, a stack includes first and second wiring structures and an inspection circuit. The inspection circuit includes a switching circuit having an input terminal, a drive terminal, and an output terminal electrically connected with a discharge mechanism. The inspection circuit is configured such that, in a state where a first electric connection is made in the first wiring structure and a second electric connection is made in the second wiring structure, at the time of applying charges to first and second electrodes, the charge applied to the second electrode flows to the drive terminal through the second wiring structure to bring the input terminal and the output terminal of the switching circuit into an electrically conducted state, and the charge applied to the first electrode flows to the discharge mechanism through the first wiring structure and the switching circuit.

19 Claims, 10 Drawing Sheets

STACK INCLUDING INSPECTION CIRCUIT, INSPECTION METHOD AND INSPECTION APPARATUS

CROSS-REFERENCE TO RELATED APPLICATION

This application is based upon and claims the benefit of priority from prior Japanese Patent Application No. 2013-16958, filed on Jan. 31, 2013, the entire contents of which are incorporated herein by reference.

FIELD

Embodiments of the present invention relate to an inspection circuit of a semiconductor device, an inspection method and an inspection apparatus.

BACKGROUND

A semiconductor circuit configured of a transistor, a storage device and the like which are formed on a semiconductor chip is connected with an electric circuit or the like outside a semiconductor device by use of a contact terminal on the front surface of the semiconductor chip. Examples of the contact terminal include a solder bump. Generally, the solder bump is formed by depositing a solder layer on a bump pad, provided on the semiconductor chip, by means of plating. At this time, it is of necessity to connect the bump pad and the solder bump in an electrically favorable manner, and the electric connection therebetween has been ensured by managing a manufacturing process for the semiconductor device. Moreover, also in a semiconductor chip having a plurality of solder bumps and a semiconductor device used for a multi-chip module formed by mutually connecting a plurality of semiconductor chips, when any of electric connections between the plurality of bump pads and solder bumps has a connection failure, the whole is judged as a failure, and hence it is of necessity to ensure electric connections between all the bump pads and solder bumps.

However, even when the manufacturing process is strictly managed, it is difficult to avoid occurrence of the connection failure that occurs with a constant probability in the process of mass-producing products.

For this reason, it is considered that the electric connection between the bump pad and the solder bump is checked by performing a visual inspection on the semiconductor chip. However, even when the solder layer is properly formed on the bump pad from a visual standpoint, they may be electrically disconnected, and it is thus difficult to ensure the electric connection by the visual inspection. Moreover, when the number of solder bumps is large, e.g., several hundred, inspection cost increases, thereby making it difficult to virtually perform the visual inspection on all the solder bumps.

It is also considered that the electric connection between the bump pad and the solder bump is checked by pressing a metal probe against the solder bump for electric connection, and activating the semiconductor circuit formed on the solder chip, to inspect an operating state of the circuit. However, pressing the probe against all the solder bumps to perform the electric inspection causes an increase in inspection cost when the number of solder bumps is large or a multi-chip module is to be inspected, thereby making it difficult to virtually carry out such an inspection. Moreover, a probe mark is left on the solder bump, which can be a new cause of failure.

DETAILED DESCRIPTION

In one embodiment, a stack includes: a semiconductor substrate; a first wiring structure for electrically connecting a first electrode exposed on the front surface of the stack and a first terminal located in the stack; a second wiring structure for electrically connecting a second electrode exposed on the front surface of the stack and a second terminal located in the stack; and an inspection circuit that inspects states of electric connections in the first and second wiring structures. In the stack, the inspection circuit includes a switching circuit having an input terminal electrically connected with the first terminal, a drive terminal electrically connected with the second terminal, and an output terminal electrically connected with a discharge mechanism. The inspection circuit is configured such that, in a state where a first electric connection is made in the first wiring structure and a second electric connection is made in the second wiring structure, at the time of applying charges to the first and second electrodes, the charge applied to the second electrode flows to the drive terminal through the second wiring structure to bring the input terminal and the output terminal of the switching circuit into an electrically conducted state, and the charge applied to the first electrode flows to the discharge mechanism through the first wiring structure and the switching circuit.

Hereinafter, embodiments will be described with reference to the drawings. However, the present invention is not restricted to these embodiments. It is to be noted that a portion in common throughout the drawings is provided with a common numeral, and a repeated description thereof will be omitted. Further, the drawings are schematic views for explaining the invention and promoting understanding thereof, and some places may have shapes, sizes, ratios and the like which are different from those of an actual device, but these can be appropriately subjected to design changes in light of the following descriptions and known techniques. It is to be noted that black thick lines in FIGS. 1, 4 to 6, 7A and 8A indicate wiring.

First Embodiment

Figure 1:
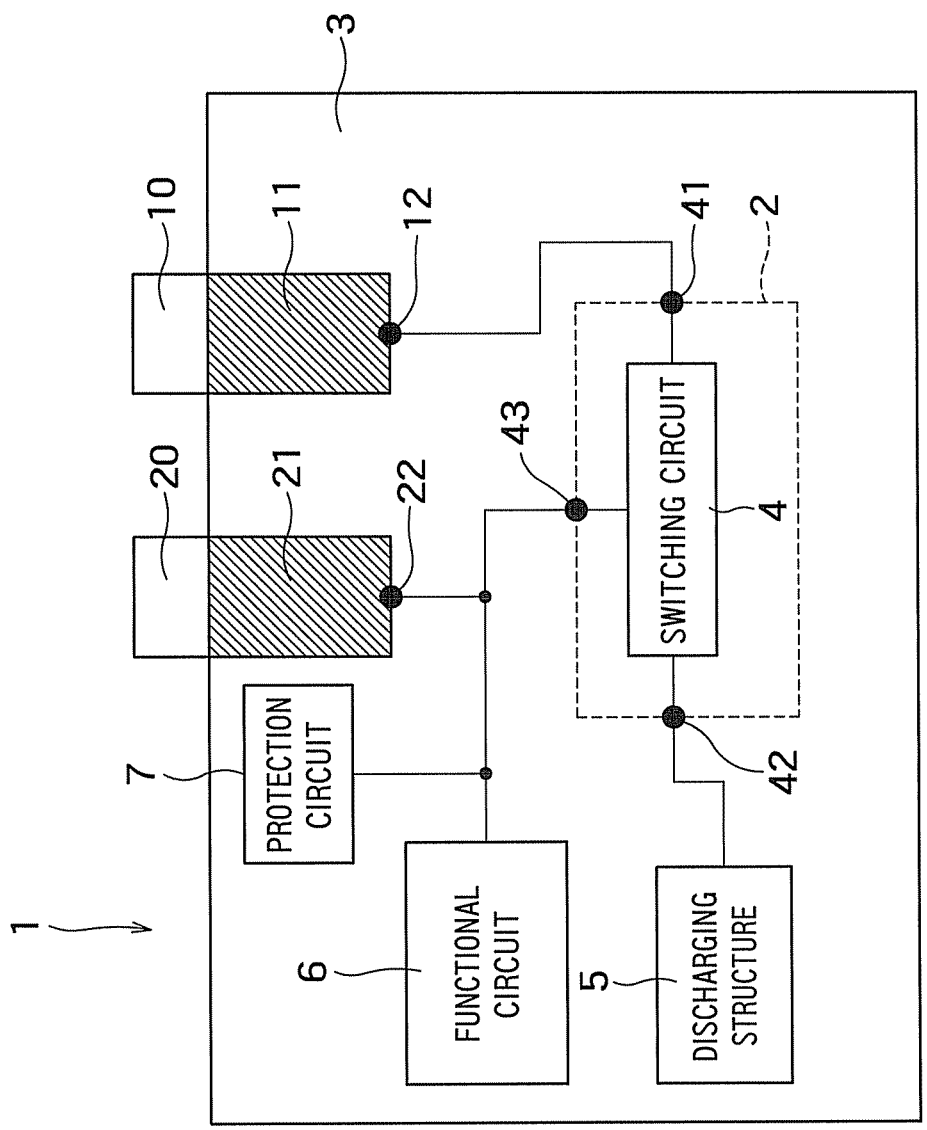
FIG. 1 is a diagram for explaining an inspection circuit of a semiconductor device according to a first embodiment.

An inspection circuit of the present embodiment will be described by use of FIG. 1 schematically showing a semiconductor device 1 provided with an inspection circuit 2 of the semiconductor device according to the present embodiment. The inspection circuit according to the present embodiment is to inspect whether electric connections in first and second wiring structures provided in the semiconductor device 1 have been ensured.

As shown in FIG. 1, a stack 3, configured including a semiconductor substrate, a wiring layer, and the like, is provided with first and second electrodes 10, 20 being in such a state where those are exposed on the front surface of the stack 3 or can be observed from the outside. Moreover, the first wiring structure 11 is provided below the first electrode 10 and inside or on the front surface of the stack 3. However, the first wiring structure 11 cannot be observed from the outside since being formed below the first electrode 10. Moreover, the first wiring structure 11 has a first terminal 12 located on the opposite side to the first electrode 10, namely the first wiring structure 11 is a wiring structure provided for electrically connecting the first electrode 10 and the first terminal 12. Furthermore, similarly to the first wiring structure 11, the second wiring structure 21 is provided below the second electrode 20 and inside or the surface of the stack 3. Accordingly, the second wiring structure 21 cannot either be observed from the outside. Moreover, the second wiring structure 21 has a second terminal 22 located on the opposite side to the second electrode 20, namely the second wiring structure 21 is a wiring structure provided for electrically connecting the second electrode 20 and the second terminal 22.

Furthermore, the second terminal 22 is electrically connected with a functional circuit block 6 provided in the stack 3 by a wire. This functional circuit block 6 is a block where circuits as semiconductor device products are collected, and is different from the inspection circuit 2 that will be described later. Moreover, the first terminal 12 may be connected to the functional circuit block 6 as necessary.

Furthermore, the inspection circuit 2 is provided in the stack 3, and the inspection circuit 2 includes a switching circuit 4 having: an input terminal 41 electrically connected with the first terminal 12 by a wire, a drive terminal 43 electrically connected with the second terminal 22 by a wire, and an output terminal 42 electrically connected with a discharge mechanism 5 provided in the stack 3 by a wire. This switching circuit 4 is such a circuit where the input terminal 41 and the output terminal 42 come into an electrically conducted state when a negative charge is applied to the drive terminal 43.

Using such an inspection circuit 2, it can be inspected whether the electric connections in the first and second wiring structures 11, 21 have been ensured, namely whether the first electrode 10 and the first terminal 12 have been electrically connected by the first wiring structure 11, and further, whether the second electrode 20 and the second terminal 22 have been electrically connected by the second wiring structure 21.

The first and second electrodes 10, 20 exposed on the front surface of the stack 3 are observed by use of a scanning electron microscope (SEM) as an inspection apparatus. At this time, the two electrodes 10, 20 are observed in the same field of view, whereby negative charges are simultaneously applied to both the first and second electrodes 10, 20 from an electronic probe of the SEM without touching the first and second electrodes 10, 20. It should be noted that in the present embodiment, it is preferable to use the electronic probe under such conditions where negative charges are applied to the first and second electrodes 10, 20 exposed on the front surface of the stack 3 and a voltage is low so as to prevent excessive charging of the insulating surface of the stack 3.

In such a state, when the electric connections in the first and second wiring structures 11, 21 have been ensured, the negative charge applied to the second electrode 20 flows to the second terminal 22 through the second wiring structure 21, and further flows from the second terminal 22 to the drive terminal 43 of the switching circuit 4, thereby bringing the input terminal 41 and the output terminal 42 of the switching circuit 4 into an electrically conducted state. Then, the negative charge applied to the first electrode 10 flows to the first terminal 12 through the first wiring structure 11, further flows from the input terminal 41 to the output terminal 42 of the switching circuit 4 in the electrically conducted state, and eventually flows to the discharge mechanism 5. Accordingly, travelling of the negative charge from the first electrode 10 by the inspection circuit 2 leads to a decrease in charged amount of the first electrode 10.

Incidentally, in the observation by the SEM, a charged place brings about halation due to an increase in discharged amount of secondary electrons and is thus seen shining white, and on the other hand, an uncharged place is seen more darkly as compared with the charged place. Hence in the present embodiment, as understood from the above description, the first electrode 10 is seen darkly in the observation by the SEM due to a decrease in charge amount of the first electrode 10 by the inspection circuit 2. Accordingly, when the first electrode 10 is seen darkly, it can be determined that the electric connections in the first and second wiring structures 11, 21 can be ensured.

On the other hand, in a case where the electric connection in the second wiring structure 21 has not been ensured, even when a charge is applied to the second electrode 20, the charge does not flow to the drive terminal of the switching circuit 4, thereby not bringing the input terminal 41 and the output terminal 42 of the switching circuit 4 into an electrically conducted state. Since the negative charge applied to the first electrode 10 cannot travel, the discharged amount of the first electrode 10 is not reduced, and in the observation by the SEM, the first electrode 10 is seen shining white. Accordingly, when the first electrode 10 is seen shining white by the observation of the first electrode 10 by the SEM, it can be determined that at least one of the electric connections in the first and second wiring structures 11, 21 has not been ensured.

Moreover, in a case where the electric connection in the first wiring structure 11 has not been ensured, even when the charge is applied to the first electrode 10, it does not flow to the first terminal 12, whereby the charged amount of the first electrode 10 does not decrease and the first electrode 10 is seen shining white. Accordingly, when the first electrode 10 is seen shining white, it can be determined that at least one of the electric connections in the first and second wiring structures 11, 21 has not been ensured.

Figure 2:
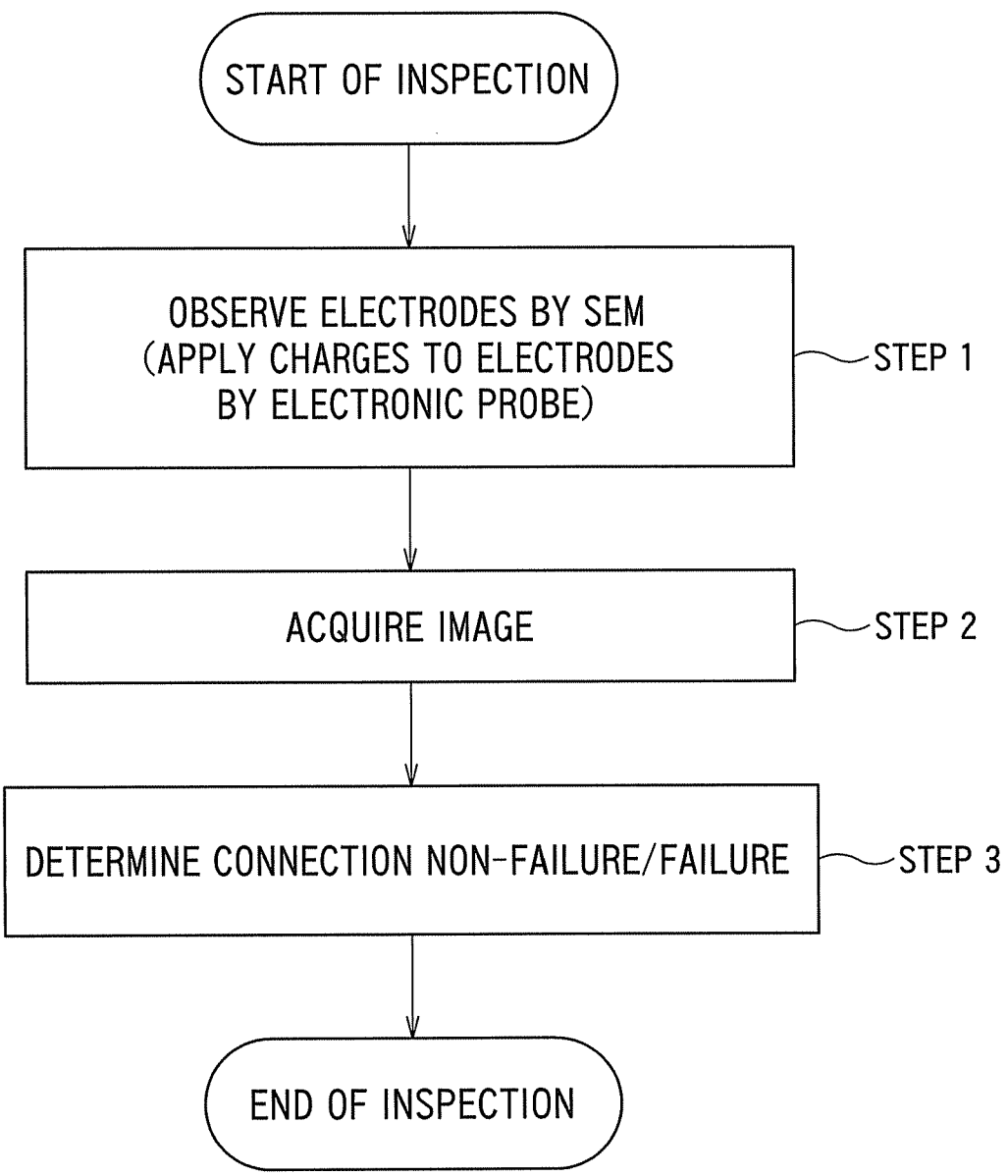
FIG. 2 is a flowchart for explaining a semiconductor device inspecting method according to the first embodiment.

In the inspection method of the present embodiment, the first and second electrodes 10, 20 exposed on the front surface of the stack 3 are observed using the SEM as the visual inspection apparatus, thereby to apply negative charges to the two electrodes 10, 20 (Step 1). Next, a contrast image of the first electrode 10 in a secondary electric image is acquired using the SEM (Step 2). Then, based on the obtained image, it is inspected/determined whether or not the electric connections in the first and second wiring structures 11, 21 have been ensured, without touching the first and second electrodes 10, 20 (Step 3). FIG. 2 shows a flowchart of the inspection method of the present embodiment.

Figure 3:
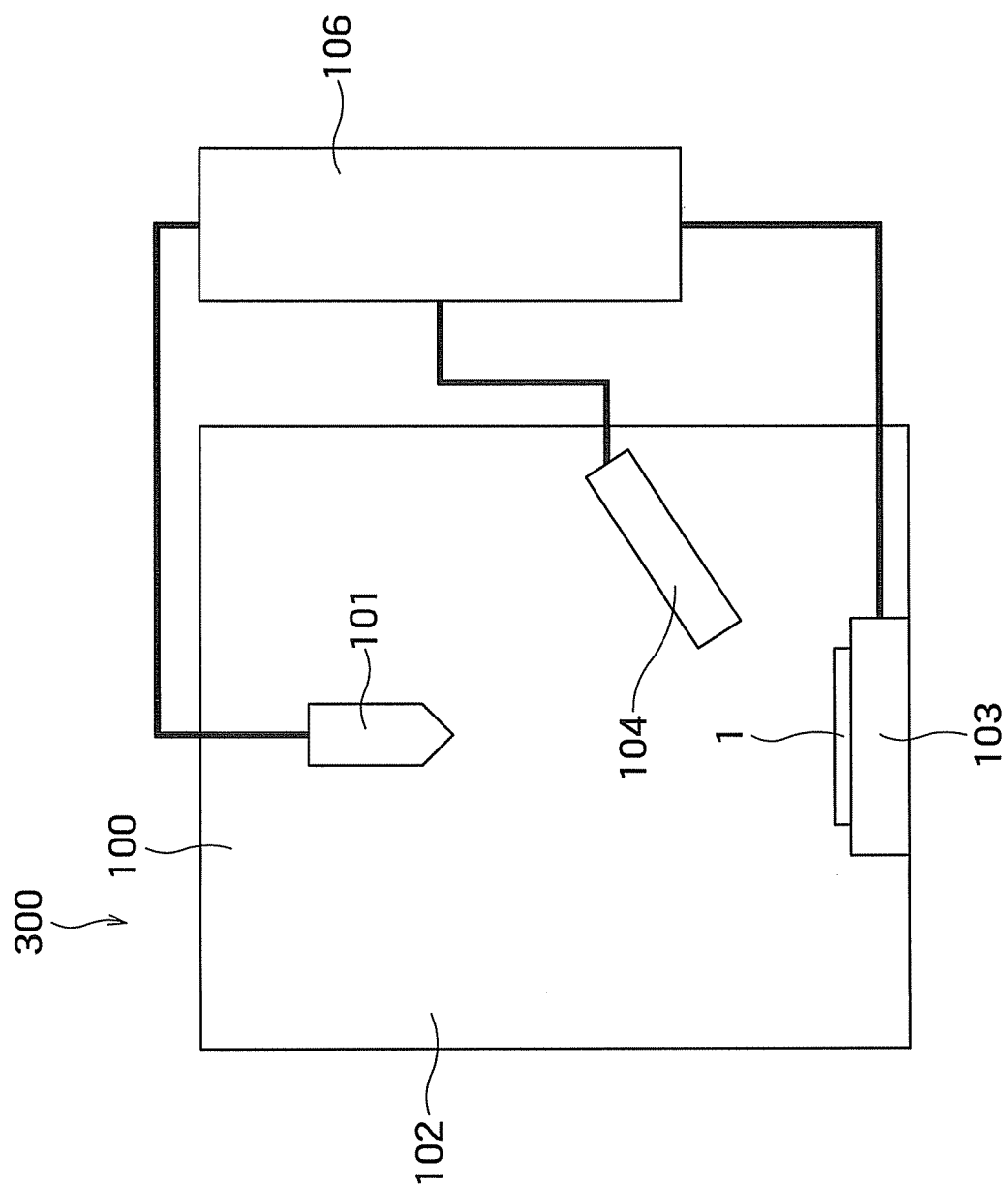
FIG. 3 is a view schematically showing an inspection apparatus for a semiconductor device according to the first embodiment.

Further, FIG. 3 shows an inspection apparatus 300 of the present embodiment. The inspection apparatus 300 has an SEM 100. This SEM 100 includes: a chamber 102 that stores the semiconductor device 1 having the inspection circuit 2; a stage 103, on which the semiconductor device 1 provided inside the chamber 102 is installed; an electronic probe 101 for applying charges to the first and second electrodes 10, 20; and an image acquiring section 104 that observes charged states of the first and second electrodes 10, 20 in accordance with an operating state of the inspection circuit 2. Moreover, the electronic probe 101, the image acquiring section 104, the stage 103 and the like of the SEM 100 can be connected with a computer 106, and by controlling the electronic probe 101 and the like by the computer 106, the inspection method according to the present embodiment can be automatically performed.

Furthermore, at least part of the inspection methods according to the present embodiment can be configured of software, and in the case of configuring it of the software, a program that realizes at least part of these inspection methods may be stored into a record medium such as a flexible disk or a CD-ROM, and it may be read by a computer 106 being in the inspection apparatus 300 or connected with the inspection apparatus 300. The record medium is not restricted to removable one such as a magnetic disk or an optical disk, but may be a fixed-type one such as a hard disk unit and a memory. Moreover, a program that executes at least part of these inspection methods may be distributed via a communication line (including a wireless communication), such as the Internet. Furthermore, the program in a coded, modulated or shrunk state may be distributed via a wired or a wireless communication such as the Internet, or by being stored into a record medium.

According to the present embodiment, it is possible to inspect whether or not the electric connections in the first and second wiring structures 11, 21 have been ensured, without touching the first and second electrodes 10, 20 exposed on the stack 3. Hence it is possible to avoid mechanical destruction or contamination of the semiconductor device 1. Further, since the inspection can be performed on even the semiconductor device 1 having a large number of wiring structures by observing an electrode by the SEM, it is possible to perform the inspection easily at low cost.

It is to be noted that, when the electric connection in the second wiring structure 21 is in an ensured state and a negative charge is applied to the second electrode 20, a protection circuit 7 configured of a diode, a circuit and the like may be electrically connected to the second electrode 20 or the second terminal 22 in order to prevent the functional circuit block 6 from performing an unexpected operation.

Second Embodiment

Figure 4:
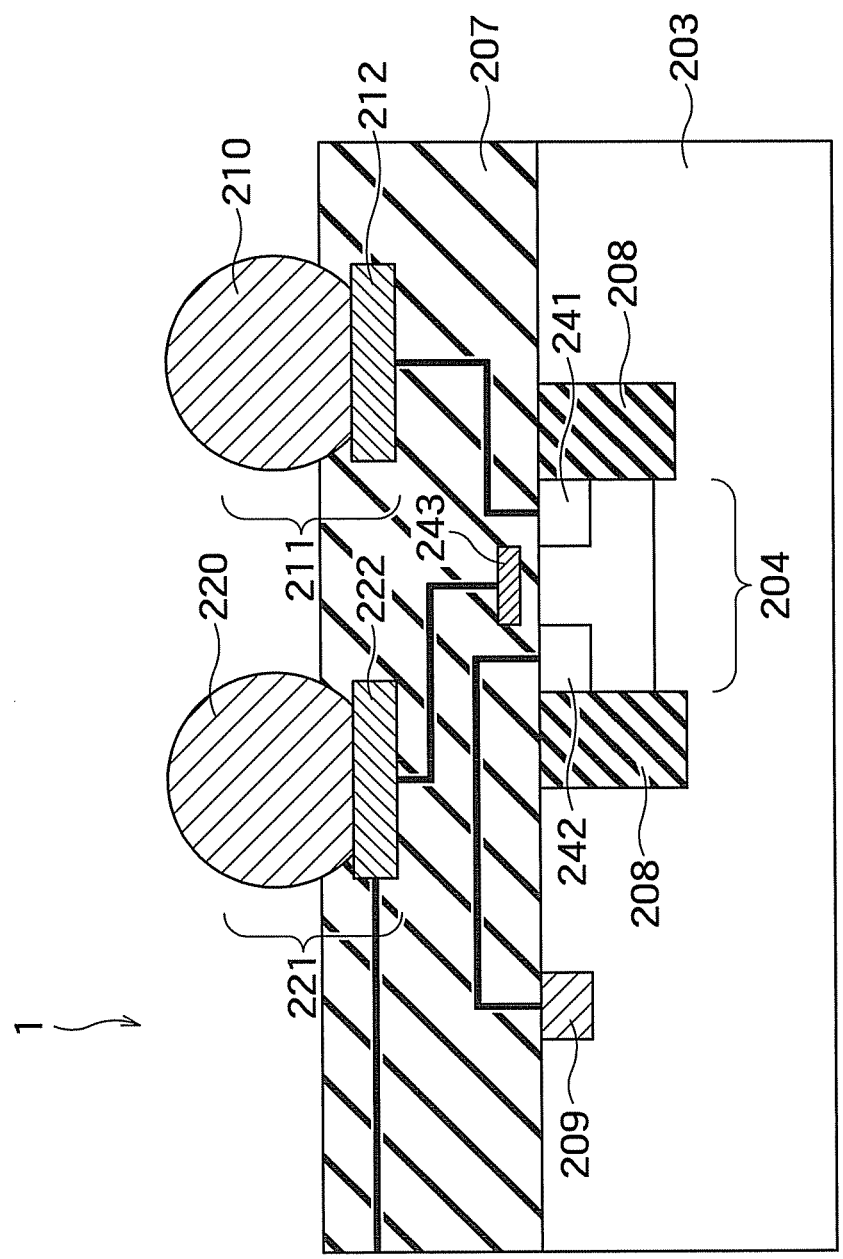
FIG. 4 is a sectional view of a semiconductor device according to a second embodiment.

The present embodiment is one using a solder bump structure as the wiring structure, and inspects whether the electric connection in the solder bump structure provided in the semiconductor device 1 has been ensured. The present embodiment will be described using FIG. 4 schematically showing a cross section of the semiconductor device 1. However, the present invention is not restricted to this wiring structure. Herein, a portion having the same configuration and function as in the first embodiment is provided with the same numeral as in the first embodiment, and a description thereof will be omitted.

As shown in FIG. 4, the stack 3 of the first embodiment corresponds to a stack of a p-type silicon substrate 203 and a wiring layer 207 where conductive material sections such as wires and vias are provided in an insulating film in the present embodiment. The first and second electrodes 10, 20 of the first embodiment corresponds to first and second solder bumps 210, 220 exposed on the front surface of the wiring layer 207. The first and second terminals 12, 22 of the first embodiment correspond to first and second bump pads 212, 222 formed in the wiring layer 207. Moreover, the first and second wiring structures 11, 21 of the first embodiment correspond to a first solder bump structure 211 for electrically connecting the first solder bump 210 and the first bump pad 212, and second solder bump structure 221 for electrically connecting the second solder bump 220 and the second bump pad 222 in the present embodiment. Furthermore, in FIG. 4, the bump pad 222 is electrically connected with a circuit such as a functional circuit block (not shown) by use of a wire.

The switching circuit 4 of the first embodiment is configured of a PMOS 204 formed in the p-type silicon substrate 203 in the present embodiment. Specifically, the PMOS 204 has an n-type layer formed in the p-type silicon substrate 203 and a pair of p-type layers formed on the n-type layer, and is sandwiched between a pair of STIs (shallow trench isolations) 208.

More specifically, the drive terminal 43 of the first embodiment corresponds to a gate 243 in the PMOS 204, which is electrically connected with the second bump pad 222 by the wire formed in the wiring layer 207. The input terminal 41 of the first embodiment corresponds to a drain 241 made up of one p-type layer in the PMOS 204, which is electrically connected with the first bump pad 212 by the wire formed in the wiring layer 207. The output terminal 42 of the first embodiment corresponds to a source 242 made up of the other p-type layer in the PMOS 204.

Moreover, the discharge mechanism 5 of the first embodiment is the p-type silicon substrate 203 in the present embodiment, which is electrically connected with the source 242 by the wire formed in the wiring layer 207 and a substrate connecting section 209 made up of the p-type layer provided on the p-type silicon substrate 203. Therefore, the negative charge having reached the p-type silicon substrate 203 as the discharge mechanism 5 is gradually discharged from the exposed surface of the p-type silicon substrate 203.

Similarly to the first embodiment, in a case where the electric connections in the first and second solder bump structures 211, 221 have been ensured, when negative charges are applied to the first and second solder bumps 210, 220 exposed on the front surface of the wiring layer 207 by use of the electronic probe, the negative charge is applied from the second solder bump 220 to a gate 243 of the PMOS 204 through the second bump pad 222. Therefore, with a negative voltage applied to the gate 243, the PMOS circuit 204 comes into an ON state, namely, the source 242 and the drain 241 come into an electrically conducted state. Moreover, the negative charge applied to the first solder bump 210 flows from the first bump pad 212 to the source 242 through a drain 241 of the PMOS 204, and eventually flows to the p-type silicon substrate 203.

As seen from the above description, similarly to the first embodiment, it is also possible in the present embodiment to inspect whether the electric connections in the solder bump structures 211, 221 have been ensured. A detailed description will be omitted herein since it is the same as in the first embodiment.

According to the present embodiment, it is possible to inspect whether the electric connections in the solder bump structures 211, 221 have been ensured by observing the first solder bump 210. Since the inspection can be performed without touching the first and second solder bumps 210, 220 exposed on the wiring layer 207, it is possible to avoid mechanical destruction or contamination of the semiconductor device 1. Further, it is possible to perform the inspection easily at low cost even on the semiconductor device 1 having a large number of solder bump structures.

Third Embodiment

Figure 5:
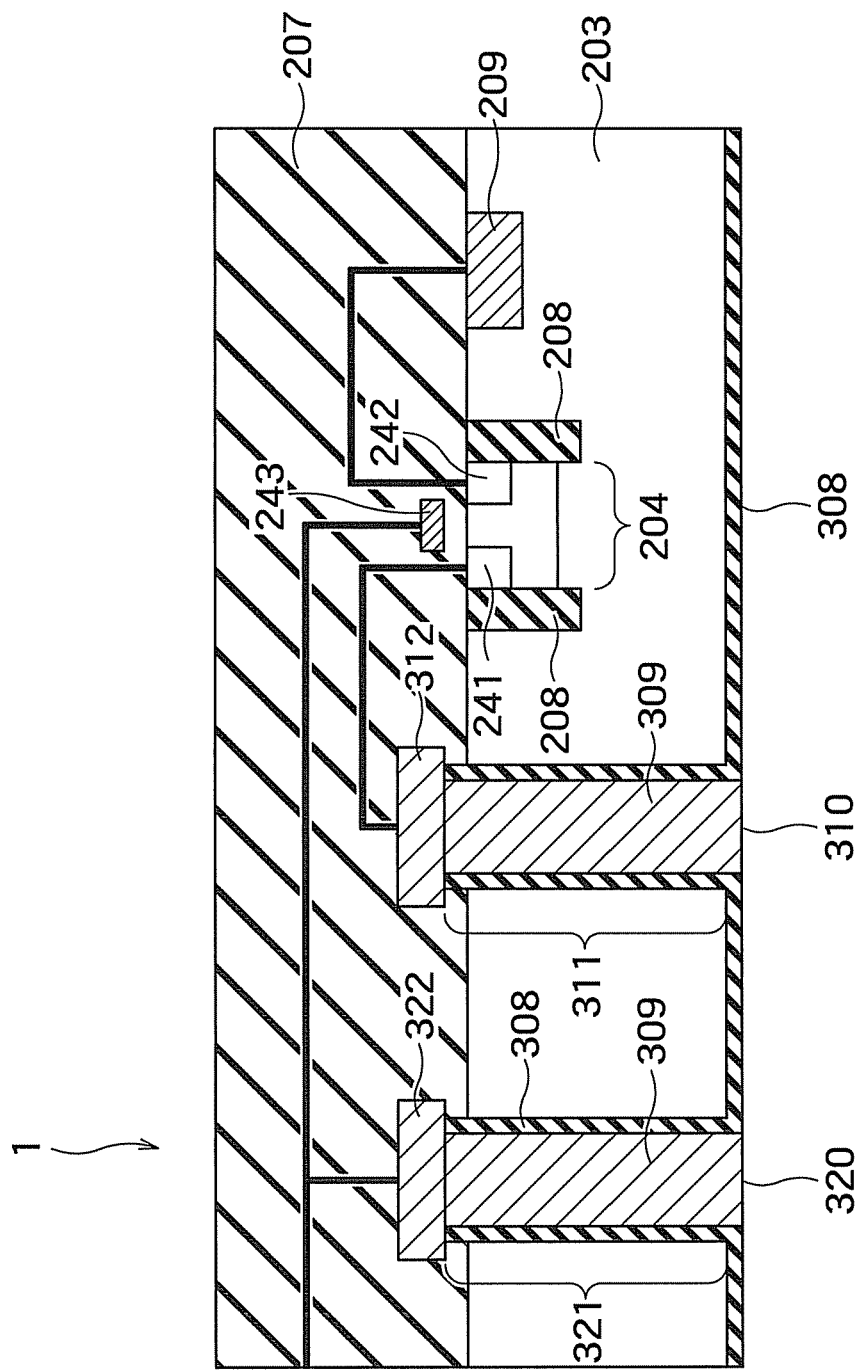
FIG. 5 is a sectional view of a semiconductor device according to a third embodiment.

The present embodiment is different from the second embodiment in that a through-silicon via structure is used as the wiring structure. That is, the present embodiment is to inspect whether the electric connections in first and second through-silicon via structures have been ensured. The present embodiment will be described using FIG. 5 schematically showing a cross section of the semiconductor device 1. However, the present invention is not restricted to this wiring structure. Herein, a portion having the same configuration and function as in the first and second embodiments is provided with the same numeral as in the first and second embodiments, and a description thereof will be omitted.

As shown in FIG. 5, the semiconductor device 1 of the present embodiment has a stacking of the p-type silicon substrate 203 and the wiring layer 207. The first and second solder bumps 210, 220 of the second embodiment corresponds to front surfaces 310, 320 of first and second through-silicon vias in the present embodiment. The first and second bump pads 212, 222 of the second embodiment correspond to first and second via pads 312, 322 formed in the wiring layer 207. The first and second solder bump structures 211, 221 of the second embodiment correspond to first and second through-silicon via structures 311, 321 formed on the p-type silicon substrate 203.

More specifically, the first and second through-silicon via structures 311, 321 have openings passing through the p-type silicon substrate 203 from its rear surface to its front surface. The side wall of the inside of the opening is covered by an insulating layer 308, and the opening is further filled with a metal film 309. This metal film 309 serves to electrically connect the front surfaces 310, 320 of the first and second through-silicon vias exposed on the rear surface of the p-type silicon substrate 203 and the first and second via pads 312, 322. Moreover, the rear surface of the p-type silicon substrate 203 is covered by the insulating layer 308 except for the front surfaces 310, 320 of the first and second through-silicon vias.

Also in the present embodiment, similarly to the first and second embodiments, it is possible to perform inspection whether or not the electric connections in the first and second through-silicon via structures 311, 321 have been ensured. However, a detailed description will be omitted herein since it is the same as in the first and second embodiments.

According to the present embodiment, it is possible to inspect whether the electric connections in the first and second through-silicon via structures 311, 321 have been ensured by observing the surface 310 of the first through-silicon via. Since the inspection can be performed without touching the front surfaces 310, 320 of the first and second through-silicon vias exposed on the p-type silicon substrate 203, it is possible to avoid mechanical destruction or contamination of the semiconductor device 1. Further, it is possible to perform the inspection easily at low cost even on the semiconductor device 1 having a large number of through-silicon via structures.

Fourth Embodiment

Figure 6:
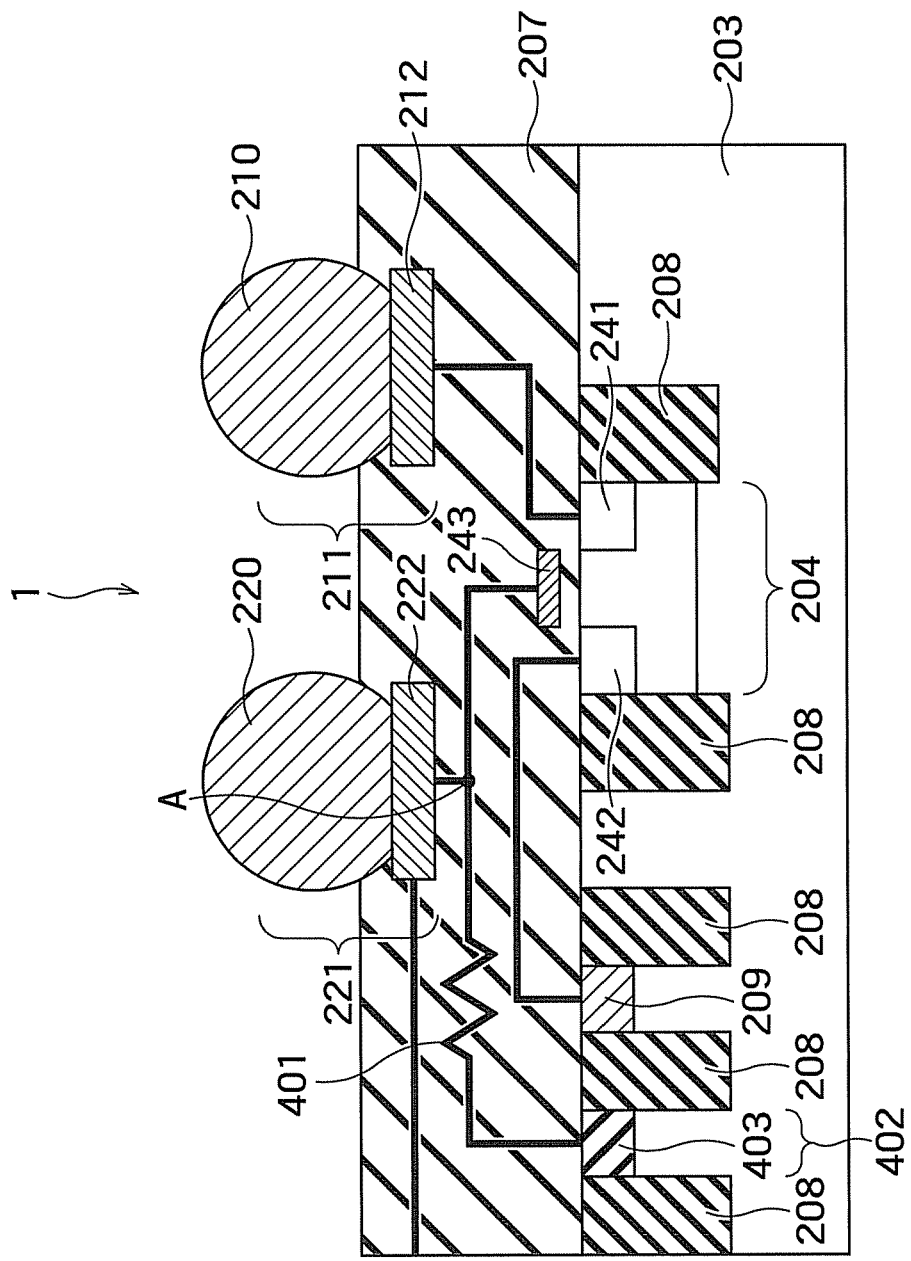
FIG. 6 is a sectional view of a semiconductor device according to a fourth embodiment.

The present embodiment is different from the second embodiment in that a resistive component and a diode are provided between the second bump pad 222 and the p-type silicon substrate 203. The present embodiment will be described using FIG. 6 schematically showing a cross section of the semiconductor device 1. However, the present invention is not restricted to this wiring structure. Herein, a portion having the same configuration and function as in the first to third embodiments is provided with the same numeral as in the first to third embodiments, and a description thereof will be omitted.

As shown in FIG. 6, in the present embodiment, a resistive component 401 and a diode 402 are provided between the second bump pad 222 and the p-type silicon substrate 203. Specifically, the resistive component 401 can be used, for example, as a high-resistive wire. However, this is not restrictive, but a resistive element and the like may be used. Moreover, in the following description, as shown in FIG. 6, a position at which a wire is branched from the second bump pad 222 to the gate 243 and the resistive component 401 is referred to as a branch point A.

Furthermore, as the diode 402, a diode connection between an n-type layer 403 provided on the p-type silicon substrate 203 and the p-type silicon substrate 203 can be used. This diode 402 is provided for the purpose of preventing that, when a positive charge is applied to the second solder bump 220 from the outside, the positive charge flows to the p-type silicon substrate 203 and an element (not shown), a functional circuit block (not shown) or the like provided on the p-type silicon substrate 203 performs an unexpected operation or becomes defective. Further, the diode 402 and the substrate connecting section 209 are separated from each other by the STI 208 provided on the p-type silicon substrate 203.

In the present embodiment, when a negative charge is applied to the second solder bump 220 by the electronic probe, the negative charge also flows to the p-type silicon substrate 203 through the resistive component 401. At this time, a voltage applied to the gate 243 of the PMOS 204 is decided by a value of a current flowing from the second solder bump 220 to the p-type silicon substrate 203 through the resistive component 401, a resistive value from the second solder bump 220 to the wire branch point A, and a resistive value from the wire branch point A to the p-type silicon substrate 203 through the resistive component 401.

Accordingly, in the present embodiment, a value of the resistive component 401 is previously set such that PMOS 204 comes into an ON state only in a state where the electric connection in the second solder bump structure 221 has been favorably ensured. In this manner, when the electric connection between the second solder bump 220 and the second bump pad 222 has not been preferably ensured, a resistive value between the second solder bump 220 and the second bump pad 222 increases, leading to a decrease in absolute value of the negative voltage that is applied to the gate 243, and thus the PMOS 204 does not come into an ON state. Therefore, in the present embodiment, even when the electric connection in the second solder bump structure 221 is not as poor as being said to be in an electrically disconnected state, but even when there is a connection failure as in a high-resistive connected state, such as a contact failure, it can be detected.

That is, in the first to third embodiments as described so far, for example, the inspection has been performed regarding only the case of the second solder bump structure 221 being in an electrically disconnected state as the state where the electric connection has not been ensured, the inspection can be performed regarding not only the case of the second solder bump structure 221 being in an electrically disconnected state, but also the case of such a connection failure as to be in a high-resistive connected state, as the state where the electric connection in the second solder bump structure 221 has not been ensured. Moreover, according to the present embodiment, it is possible to inspect whether the electric connections in the solder bump structures 211, 221 have been ensured by observing the first solder bump 210. Since the inspection can be performed without touching the first and second solder bumps 210, 220 exposed on the wiring layer 207, it is possible to avoid mechanical destruction or contamination of the semiconductor device 1. Further, it is possible to perform the inspection easily at low cost even on the semiconductor device 1 having a large number of solder bump structures.

Fifth Embodiment

The present embodiment is different from the second embodiment in that the semiconductor device 1 has a plurality of second solder bump structures 221. The present embodiment will be described using FIGS. 7A and 7B. However, the present invention is not restricted to this wiring structure. Herein, a portion having the same configuration and function as in the first to fourth embodiments is provided with the same numeral as in the first to fourth embodiments, and a description thereof will be omitted.

Figure 7A:
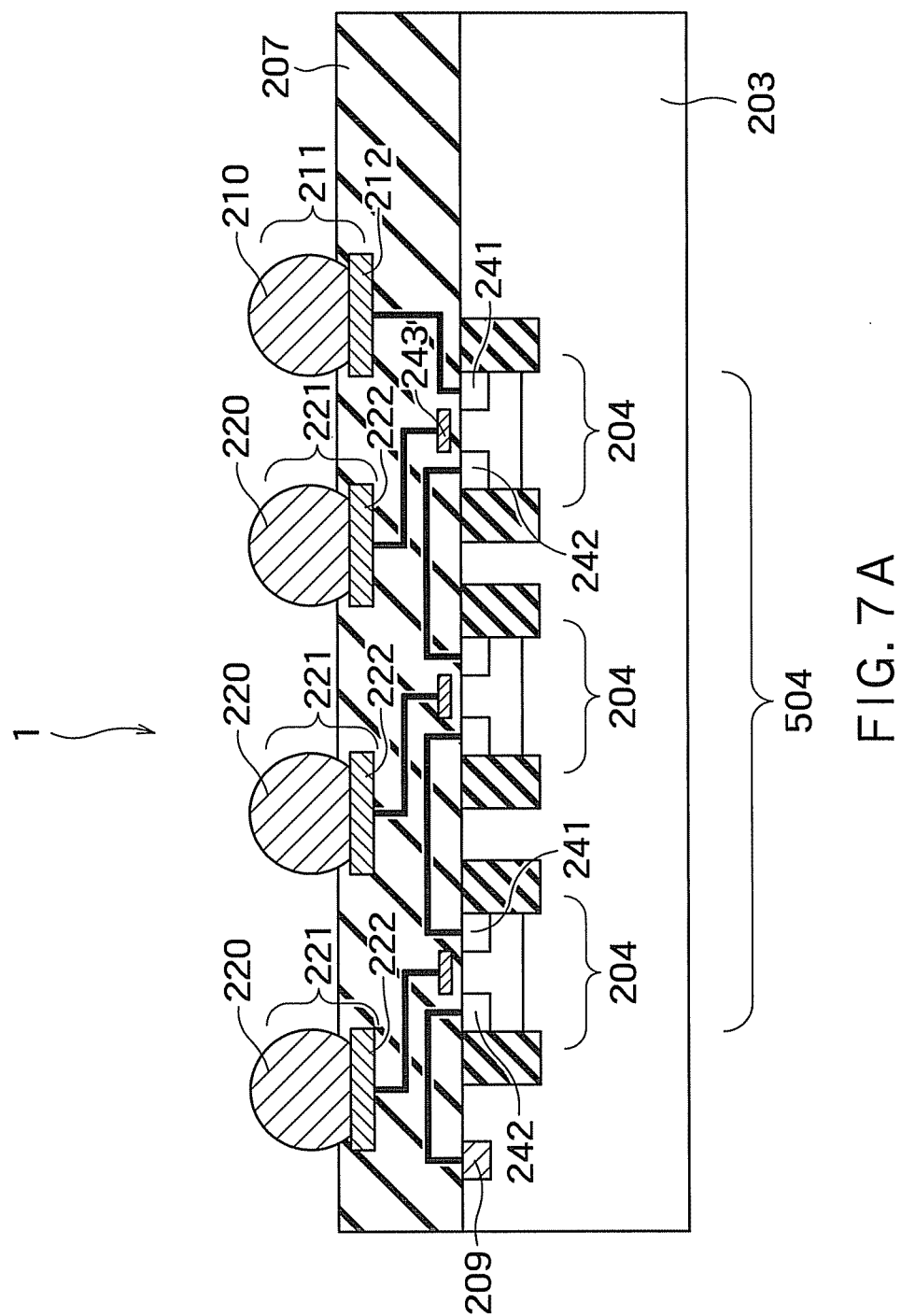
FIG. 7A is a sectional view of a semiconductor device according to a fifth embodiment.
Figure 7B:
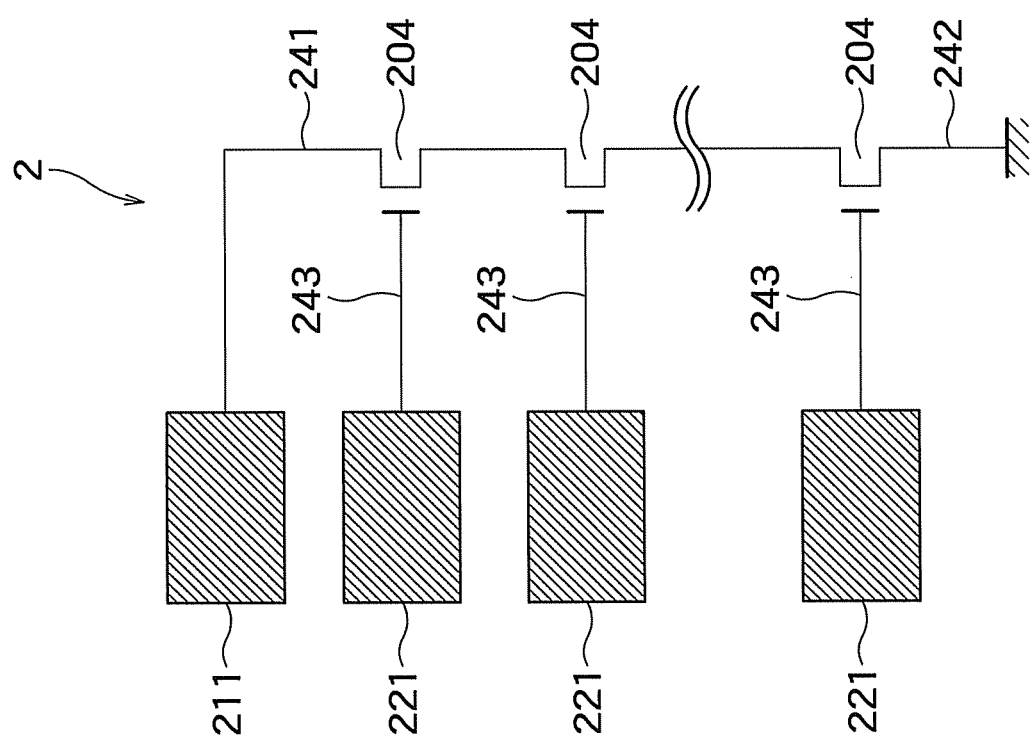
FIG. 7B is a circuit diagram of the semiconductor device shown in FIG. 7A.

FIG. 7A is a sectional view of a semiconductor device 1 of the present embodiment, and FIG. 7B is a circuit diagram of the inspection circuit 2 of the present embodiment.

As shown in FIG. 7A, in the present embodiment, one first solder bump structure 211 having the first solder bump 210 and the first bump pad 212 is formed, and a plurality of second solder bump structures 221 having the second solder bump 220 and the second bump pad 222 are formed. Then, a plurality of PMOSs 204 are formed in the p-type silicon substrate 203, and the respective sources 242 and the drains 241 are electrically connected to each other, to form a transistor array 504 composed of the plurality of serially connected PMOSs 204. In the present embodiment, this transistor array 504 corresponds to the inspection circuit 2 in FIG. 1.

Specifically, the gate 243 of each PMOS 204 of this transistor array 504 is connected to each second bump pad 222, the drain 241 of the PMOS 204 at one end of the transistor array 504 is connected to the first bump pad 212, and the source 242 of the PMOS 204 at the other end of the transistor array 504 is electrically connected to the p-type silicon substrate 203 as the discharge mechanism 5 through the substrate connecting section 209. That is, the first and second solder bump structures 211, 221 and the transistor array 504 are connected as in the circuit diagram of FIG. 7B.

Accordingly, as obviously seen from the circuit diagram of FIG. 7B, in the present embodiment, when negative charges are applied to the first and second solder bumps 210, 220 exposed on the front surface of the wiring layer 207 in a state where the electric connections in the first and second solder bump structures 211, 221 have been ensured, the negative charge applied to each second solder bump 220 flows to the gate 243 of each PMOS 204 of the transistor array 504, to brings each PMOS circuit 204 into an ON state. Moreover, the negative charge applied to the first solder bump 210 flows to the drain 241 of the PMOS 204 at one end of the transistor array 504, flows to the source 242 of PMOS 204 at the other end of the transistor array 504 through each PMOS circuit 204 of the transistor array 504 in the ON state, and eventually flows to the p-type silicon substrate 203 as the discharge mechanism 5. Therefore, in the present embodiment, when the electric connection has not been ensured in any one of all the second solder bump structures 221 and the first solder bump structure 211, the charge applied to the first solder bump 210 does not flow to the p-type silicon substrate 203, and hence the first solder bump 210 is not reduced in charged amount, and is thus seen shining white in the observation by the SEM.

As seen from the above description, also in the present embodiment, it is possible to inspect whether the electric connections in the solder bump structures have been ensured. A detailed description will be omitted herein since it is the same as in the first embodiment.

According to the present embodiment, even in the semiconductor device 1 having a plurality of solder bump structures, it is possible to inspect whether the electric connections in the solder bump structures have been ensured by observing the first solder bump 210. Hence it is possible to perform the inspection further easily at low cost without touching the solder bump exposed on the wiring layer 207.

Sixth Embodiment

The present embodiment is different from the embodiments described so far in that a plurality of semiconductor devices 1 having the through-silicon via structures are applied to a multi-chip module 601 formed by stacking the semiconductor devices 1 in a direction of the thicknesses of those. That is, the present embodiment is to inspect whether the electric connections in the through-silicon via structure of each semiconductor device 1 and the solder bump structure for electrically connecting each semiconductor device 1 have been ensured. The present embodiment will be described using FIGS. 8A and 8B. However, the present invention is not restricted to this wiring structure. Herein, a portion having the same configuration and function as in the first to fifth embodiments is provided with the same numeral as in the first to fifth embodiments, and a description thereof will be omitted.

Figure 8A:
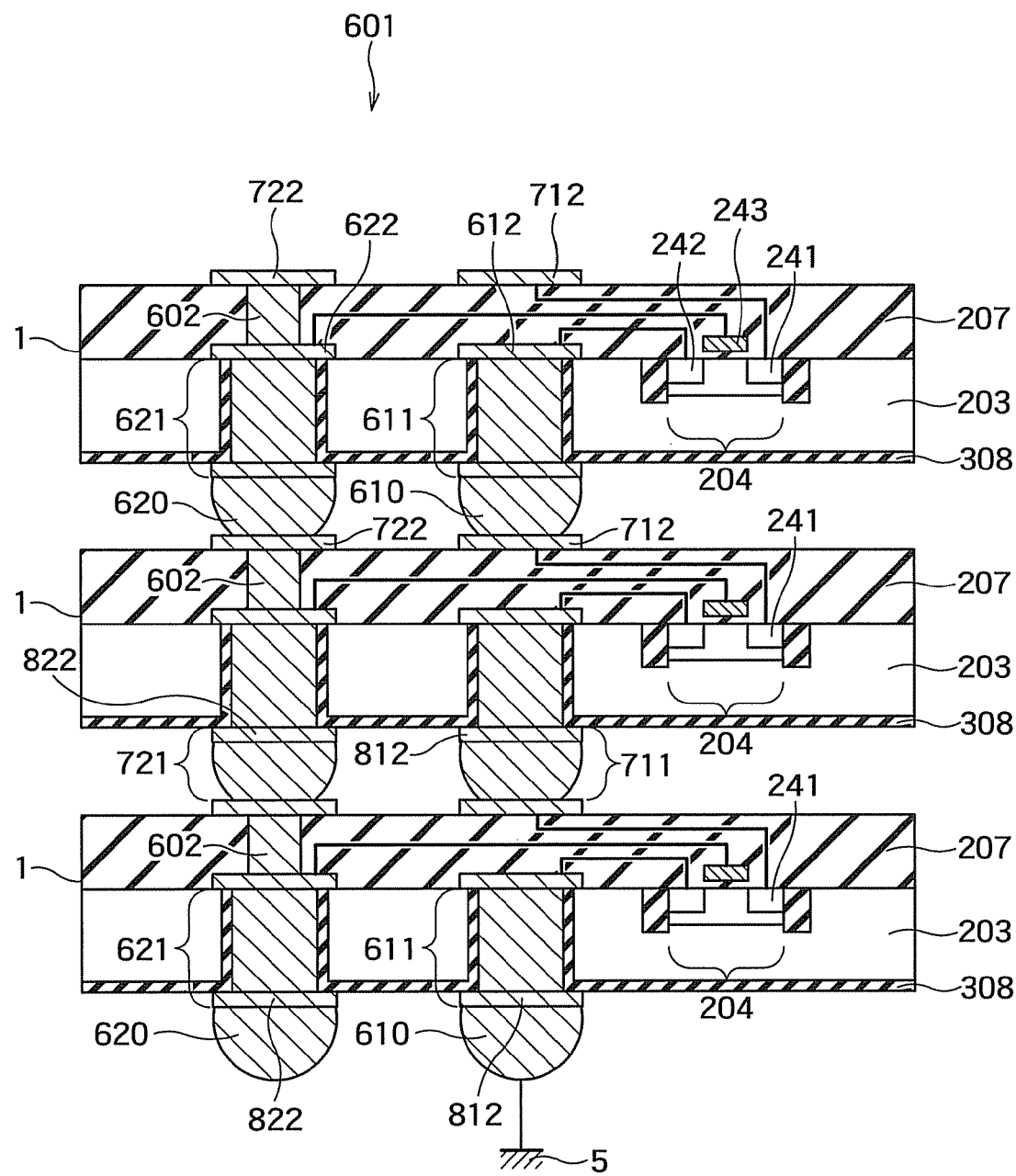
FIG. 8A is a sectional view of a semiconductor device according to a sixth embodiment.
Figure 8B:
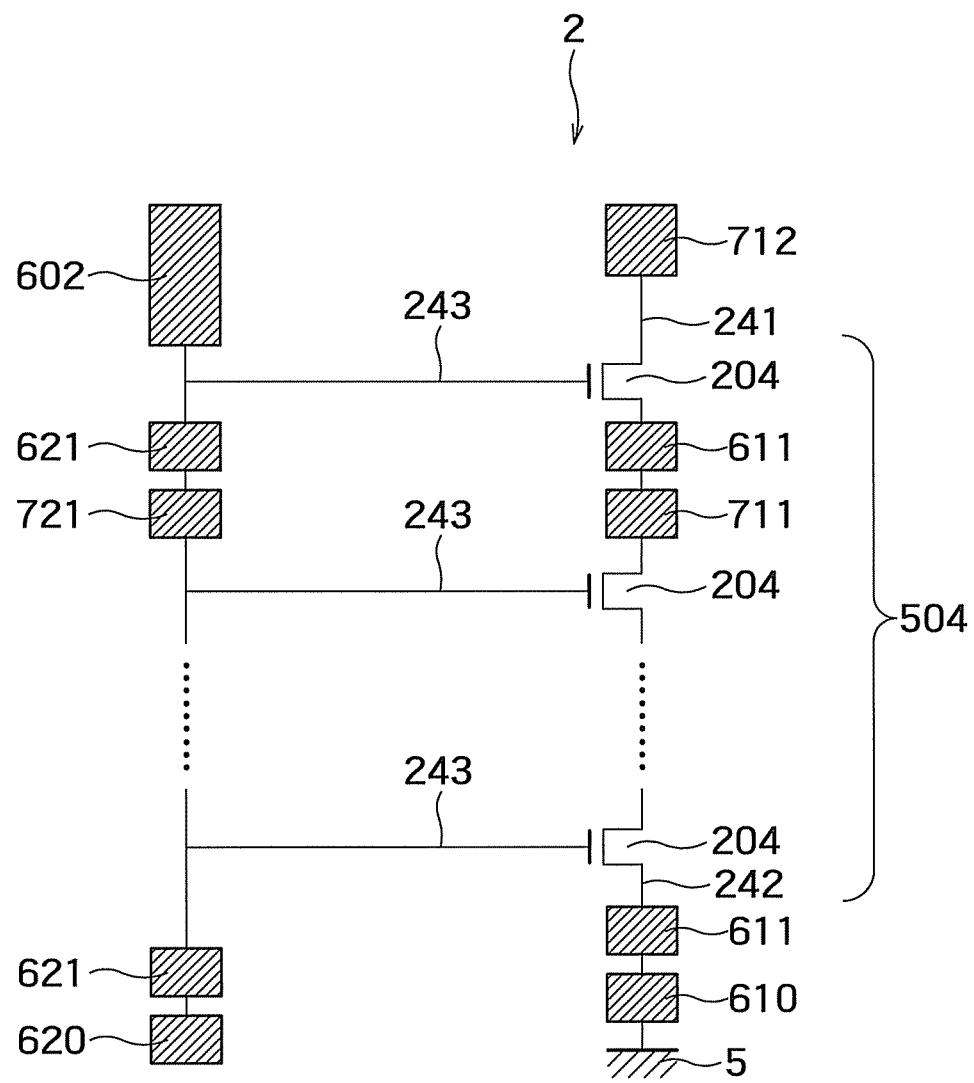
FIG. 8B is a circuit diagram of the semiconductor device shown in FIG. 8A.

FIG. 8A is a sectional view of a multi-chip module 601 of the present embodiment, and FIG. 8B is a circuit diagram of the inspection circuit 2 of the present embodiment.

As shown in FIG. 8A, the multi-chip module 601 of the present embodiment has a plurality of semiconductor devices 1 each being similar to the semiconductor device 1 of the third embodiment having the through-silicon via structure. Specifically, the semiconductor device 1 of the present embodiment has third and fourth through-silicon via structures 611, 621. The third and fourth through-silicon via structures 611, 621 are electrically connected with third and fourth via pads 612, 622 formed in the wiring layer 207. Moreover, the fourth via pad 622 is electrically connected to a fourth bump pad 722 formed on the front surface of the wiring layer 207 by a wire 602 formed in the wiring layer 207. The drain 241 of the PMOS 204 is electrically connected to a third bump pad 712 formed on the front surface of the wiring layer 207 by a wire formed in the wiring layer 207. The source 242 of the PMOS 204 is electrically connected to the third via pad 612 by a wire formed in the wiring layer 207. Furthermore, fifth and sixth bump pads 812, 822 are formed on the front surface of the third and fourth through-silicon via structures 611, 621 exposed on the rear surface of the p-type silicon substrate 203.

Then in the semiconductor devices 1 which are stacked and adjacent to one another, the fifth bump pad 812 and the third bump pad 712 are electrically connected with each other through the third solder bump 610, and the sixth bump pad 822 and the fourth bump pad 722 are electrically connected with each other through a fourth solder bump 620. Further, the third and fourth bump pads 712, 722 in the top-layer semiconductor device 1 out of the stacked plurality of semiconductor devices 1 are made observable from the outside of the multi-chip module 601. Moreover, in the bottom-layer semiconductor device 1, the fifth and sixth bump pads 812, 822 and the third and fourth solder bumps 610, 620 are formed on the front surfaces of the third and fourth through-silicon via structures 611, 621. Furthermore, the third solder bump 610 is connected with the discharge mechanism 5, such as one being grounded, and the fourth solder bump 620 is not connected with any but the sixth bump pad 822. That is, those are connected as in the circuit diagram of FIG. 8B. It should be noted that in the description below, the third solder bump structure 711 is configured of the third solder bump 610 electrically connecting the fifth bump pad 812 and the third bump pad 712, and the fourth solder bump structure 721 is configured of the fourth solder bump structure 620 electrically connecting the sixth bump pad 822 and the fourth bump pad 722.

More specifically, as seen from the circuit diagram of FIG. 8, the sources 242 and the drains 241 of the respective PMOSs 204 in each semiconductor device 1 are electrically and connected with each other in series, through the third through-silicon via structure 611 and the third solder bump structure 711, to form the transistor array 504. In the present embodiment, this transistor array 504 functions as the inspection circuit 2. Moreover, the gate 243 of the PMOS 204 in each semiconductor device 1 is connected with each other through the fourth through-silicon via structure 621 and the fourth solder bump structure 721.

Accordingly, as obviously seen from the circuit diagram of FIG. 8B, in the present embodiment, when negative charges are applied to the third and fourth bump pads 712, 722 in the top-layer semiconductor device 1 out of the stacked plurality of semiconductor devices 1 in a case where the electric connections in the third and fourth through-silicon via structures 611, 621 and the third and fourth solder bump structures 711, 721 have been ensured, the negative charge applied to fourth bump pad 722 flows to the gate 243 of each PMOS 204 of the transistor array 504, to brings each PMOS circuit 204 into an ON state. Moreover, the negative charge applied to the third bump pad 712 flows to the drain 241 of the PMOS 204 at one end of the transistor array 504, flows to the source 242 of the PMOS 204 at the other end of the transistor array 504 through each PMOS circuit 204 of the transistor array 504 in the ON state, and eventually flows to the discharge mechanism 5. Therefore, in the present embodiment, when the electric connection has not been ensured in any of all the third and fourth through-silicon via structures 611, 621 and the third and fourth solder bump structures 711, 721, the negative charge applied to the top-layer third bump pad 712 does not flow to the discharge mechanism 5, and hence the third bump pad 712 is not reduced in charged amount, and is thus seen shining white in the observation by the SEM.

As seen from the above description, it is also possible in the present embodiment to inspect whether the electric connections in the through-silicon via structure and the solder bump structure in the multi-chip module 601 have been ensured by observing the top-layer third bump pad 712. A detailed description will be omitted herein since it is the same as in the first embodiment.

According to the present embodiment, even in the multi-chip module 601 stacked with a plurality of semiconductor devices 1, it is possible to inspect easily at low cost whether the electric connections in the through-silicon via structure and the solder bump structure have been ensured without touching the bump pad exposed on the top-layer semiconductor device 1. It has been particularly difficult to inspect whether the electric connection has been ensured in such a multi-chip module 601 due to its structure, and the inspection has hitherto been performed, for example, by sampling a constant number of multi-chip modules 601 from a manufacturing line after assembly of the multi-chip module 601, and bringing the probe into contact with the exposed bump pad of the multi-chip module 601. However, in the present embodiment, the inspection can be performed without touching the bump pad exposed on the top-layer semiconductor device 1, making it possible to avoid mechanical destruction or contamination of the multi-chip module 601.

It is to be noted that in the first to sixth embodiment, the switching circuit is not restricted to the PMOS 204, but in order to obtain a similar effect, a conductive type such as the silicon substrate included in the stack 3 may be reversed and an NMOS can be employed, and further, another transistor such as a bipolar transistor or a circuit can be employed. Further, also in these embodiments, the inspection method and inspection apparatus described in the first embodiment can be employed. Moreover, the first to six embodiments can be combined with each other, and for example, the semiconductor device 1 having a plurality of wiring structures as in the fifth embodiment may be stacked as in the sixth embodiment, to form a multi-chip module 601. Furthermore, such a multi-chip module 601 may be combined with a resistive component as in the fourth embodiment. These embodiments are not restricted to the use for inspecting whether the electric connections in the through-silicon via structure and the solder bump structures have been ensured, but can also be used for inspecting whether the electric connection difficult to inspect from the outside, for example, an electric connection by a wire or the like in the stack, has been ensured.

Moreover, it is possible to use a general low-voltage SEM apparatus as the inspection apparatus for performing the inspection method of the present embodiment. However, when the number of second solder bumps 220 is large as in the fifth embodiment, charges need to be supplied to all the second solder bumps 220 and the first solder bump 210 while observing the first solder bump 210, and hence the inspection apparatus desirably has a configuration where an image of only the first solder bump is obtained while making a setting to include all the solder bumps in the irradiation range of the electronic probe 101, namely a configuration where the irradiation range of the electronic probe 101 is set independently of the range of the image of the first solder bump 210.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A stack comprising:
a semiconductor substrate;
a first wiring structure for electrically connecting a first electrode exposed on a front surface of the stack and a first terminal located in the stack;
a second wiring structure for electrically connecting a second electrode exposed on the front surface of the stack and a second terminal located in the stack; and
an inspection circuit that inspects states of electric connections in the first and second wiring structures,
wherein the inspection circuit includes a switching circuit having an input terminal electrically connected with the first terminal, a drive terminal electrically connected with the second terminal, and an output terminal electrically connected with a discharge mechanism, and wherein the inspection circuit is configured such that, in a state where a first electric connection is made in the first wiring structure and a second electric connection is made in the second wiring structure, at a time of applying charges to the first and second electrodes, the charge applied to the second electrode flows to the drive terminal through the second wiring structure to bring the input terminal and the output terminal of the switching circuit into an electrically conducted state, and the charge applied to the first electrode flows to the discharge mechanism through the first wiring structure and the switching circuit.

2. The stack according to claim 1, further comprising a functional circuit block electrically connected with the second terminal.

3. The stack according to claim 1, wherein the first and second wiring structures are solder bump structures for electrically connecting solder bumps and bump pads.

4. The stack according to claim 1, wherein the first and second wiring structures are through-via structures for electrically connecting through-vias and via pads.

5. The stack according to claim 1, wherein the switching circuit is a semiconductor transistor circuit.

6. The stack according to claim 5, wherein:
the semiconductor transistor circuit is a MOS circuit,
the drive terminal is a gate of the MOS circuit, and
the output terminal is a source or a drain of the MOS circuit.

7. The stack according to claim 1, further comprising a protection circuit electrically connected to the second electrode or the second terminal of the second wiring structure.

8. The stack according to claim 1, wherein the discharge mechanism is the semiconductor substrate.

9. The stack according to claim 1, wherein the second terminal of the second wiring structure is electrically connected with the semiconductor substrate through a resistive component.

10. The stack according to claim 9, wherein the resistive component is a high-resistive wire.

11. The stack according to claim 9, wherein the resistive component is electrically connected with the semiconductor substrate by a diode.

12. The stack according to claim 1, wherein:
the stack comprises a plurality of the second wiring structures,
the inspection circuit comprises a transistor array made of a plurality of serially connected transistors,
a first electrode terminal of a transistor located at one end of the transistor array is electrically connected with the first terminal of the first wiring structure,
a second electrode terminal of a transistor located at the other end of the transistor array is electrically connected with the discharge mechanism, and third electrode terminals of the transistors of the transistor array are electrically connected with the second terminals of the second wiring structures, respectively.

13. An inspection method for inspecting states of electric connections in first and second wiring structures of a stack, the stack comprising a semiconductor substrate, the first wiring structure for electrically connecting a first electrode exposed on a front surface of the stack and a first terminal located in the stack, and the second wiring structure for electrically connecting a second electrode exposed on the front surface of the stack and a second terminal located in the stack, the method comprising:

forming in the stack an inspection circuit which includes a switching circuit having an input terminal electrically connected with the first terminal, a drive terminal electrically connected with the second terminal, and an output terminal electrically connected with a discharge mechanism so that the inspection circuit is configured such that in a state where a first electric connection is made in the first wiring structure and a second electric connection is made in the second wiring structure, at a time of applying charges to the first and second electrodes, the charge applied to the second electrode flows to the drive terminal through the second wiring structure to bring the input terminal and the output terminal of the switching circuit into an electrically conducted state, and the charge applied to the first electrode flows to the discharge mechanism through the first wiring structure and the switching circuit;

applying the charges to the first and second electrodes by use of an electronic probe of a scanning electron microscope, to activate the inspection circuit according to states of electric connections in the first and second wiring structures; and observing a charged state of the first electrode by use of the scanning electron microscope.

14. The method according to claim 13, wherein the stack further comprises a functional circuit block electrically connected with the second terminal.

15. The method according to claim 13, wherein the first and second wiring structures are solder bump structures for electrically connecting solder bumps and bump pads.

16. The method according to claim 13, wherein the first and second wiring structures are through-via structures for electrically connecting through-vias and via pads.

17. The method according to claim 13, wherein the switching circuit is a semiconductor transistor circuit.

18. The method according to claim 17, wherein:
the semiconductor transistor circuit is a MOS circuit,
the drive terminal is a gate of the MOS circuit, and
the output terminal is a source or a drain of the MOS circuit.

19. The method according to claim 13, wherein the second terminal of the second wiring structure is electrically connected with the semiconductor substrate through a resistive component.

* * * * *